United States Patent
Shimizu et al.

(10) Patent No.: US 7,694,248 B2
(45) Date of Patent: Apr. 6, 2010

(54) METHOD AND APPARATUS FOR SUPPORTING VERIFICATION, AND COMPUTER PRODUCT

(75) Inventors: Toshihito Shimizu, Kawasaki (JP); Koichi Itaya, Kawasaki (JP); Hitoshi Watanabe, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 233 days.

(21) Appl. No.: 11/249,361

(22) Filed: Oct. 14, 2005

(65) Prior Publication Data

US 2006/0209603 A1 Sep. 21, 2006

(30) Foreign Application Priority Data

Mar. 18, 2005 (JP) ............................. 2005-080752

(51) Int. Cl.
*G06F 17/50* (2006.01)
(52) U.S. Cl. .................. 716/4; 716/6; 716/12; 716/18; 703/14
(58) Field of Classification Search ...................... 716/4, 716/6, 12, 18
See application file for complete search history.

(56) References Cited

U.S. PATENT DOCUMENTS

| | | | | |
|---|---|---|---|---|
| 5,650,938 | A | * 7/1997 | Bootehsaz et al. | ............. 716/6 |
| 2004/0268279 | A1 | * 12/2004 | Oleksinski | ..................... 716/6 |

FOREIGN PATENT DOCUMENTS

| | | |
|---|---|---|
| JP | 2000-222452 | 8/2000 |
| JP | 2000-276515 | 10/2000 |
| JP | 2000-348086 | 12/2000 |

* cited by examiner

*Primary Examiner*—Thuan Do

(57) ABSTRACT

An apparatus for supporting verification includes a detecting unit that detects description data of a false path from setting data for a system mode operation of a target circuit to be verified; an analyzing unit that analyzes the description data in the system mode operation and a test mode operation of the target circuit; a diversion determining unit that determines, based on a result of analysis by the analyzing unit, whether the description data is divertible to the test mode operation; and a generating unit that generates setting data for the test mode operation based on a result of determination by the determining unit.

12 Claims, 8 Drawing Sheets

FIG.3

```
create_clock -name "CLK" -period 50000 -waveform {0 25000}
[get_ports {PIN_CLK}]
create_clock -name "CLK2" -period 50000 -waveform {0 25000}
[get_ports {PIN_CLK2}]
set_input_delay 5000 -max -clock "CLK" [get_ports {PIN_TCK}]
set_input_delay 5000 -max -clock "CLK" [get_ports {PIN_TDI}]
set_input_delay 5000 -max -clock "CLK" [get_ports {PIN_TMS}]
set_input_delay 5000 -max -clock "CLK" [get_ports {PIN_TRST}]
set_input_delay 5000 -max -clock "CLK" [get_ports {PIN_DATAIN
[0]}]
set_input_delay 5000 -max -clock "CLK" [get_ports {PIN_DATAIN
[1]}]
set_input_delay 5000 -max -clock "CLK2" [get_ports {PIN_DATAIN
[2]}]
set_input_delay 5000 -max -clock "CLK2" [get_ports {PIN_DATAIN
[3]}]
set_input_delay 5000 -max -clock "CLK2" [get_ports {PIN_DATAIN
[4]}]
set_output_delay 5000 -clock "CLK2" [get_ports {PIN_DATAOUT
[4]}]
set_output_delay 5000 -clock "CLK2" [get_ports {PIN_DATAOUT
[3]}]
set_output_delay 5000 -clock "CLK2" [get_ports {PIN_DATAOUT
[2]}]
set_output_delay 5000 -clock "CLK" [get_ports {PIN_DATAOUT
[1]}]
set_output_delay 5000 -clock "CLK" [get_ports {PIN_DATAOUT
[0]}]
set_output_delay 5000 -clock "CLK" [get_ports {PIN_TDO}]
set_clock_uncertainty 1000 [get_clocks {CLK}]
set_false_path¥
    -from  [get_clocks {CLK}]¥
    -to    [get_clocks {CLK2}]

set_false_path ¥
    -from  [get_pins {FF0/Q}]¥
    -to    [get_pins {FF1/D}]
```

FIG.5

```
TCK         = "TCK"
TCK_cycle   = 100000
TCK_rise    = 0
TCK_fall    = 50000
CLOCK       = "CLK" , "CLK2"
CLOCK_cycle = 100000, 100000
CLOCK_rise  = 0, 0
CLOCK_fall  = 50000, 50000
MACRO_num   = 8
MACRO       = "RAMS0/RAMS000/WPP/RAM" ,
              "RAMS0/RAMS001/WPP/RAM" ,
              "RAMS0/RAMS002/WPP/RAM" ,
              "RAMS0/RAMS003/WPP/RAM" ,
              "RAMS0/RAMS004/WPP/RAM" ,
              "RAMS0/RAMS005/WPP/RAM" ,
              "RAMS0/RAMS006/WPP/RAM" ,
              "RAMS0/RAMS007/WPP/RAM"
                        :
                        :
```

FIG.6

```
target false path(0)

start point : FF0/Q
   start scan component : FF0
   start scan component driving clock
      system mode : CLK
      test mode   : CLK end point   : FF1/D
   end scan component : FF1
   end scan component driving clock
      system mode : CLK
      test mode   : CLK
```

FIG.7
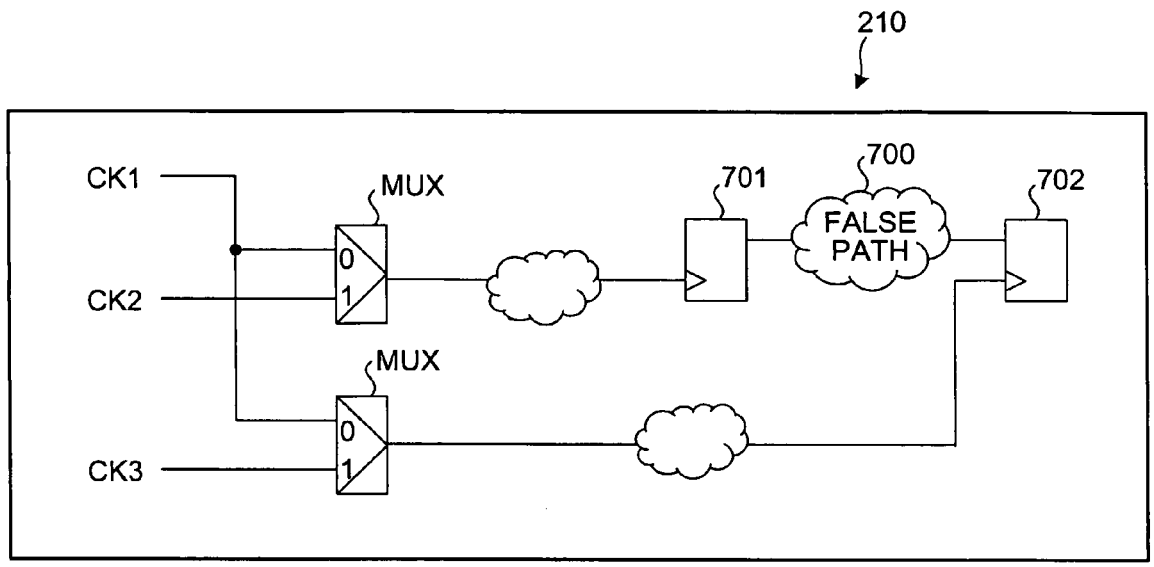
FIG.8
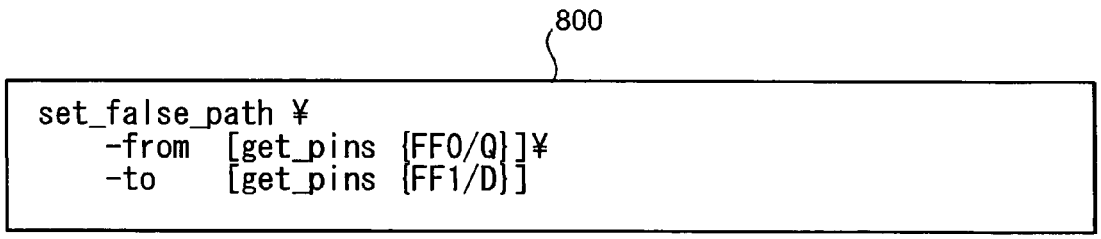
```
set_false_path ¥
    -from  [get_pins {FF0/Q}]¥
    -to    [get_pins {FF1/D}]
```
FIG.9
| TEST SCHEME | TAPC TYPE A | TAPC TYPE B | NO TAPC |
|---|---|---|---|
| BoundarySCAN | template_BS_A | template_BS_B | - |
| LogicBIST | template_LB_A | template_LB_B | template_LB_N |
| LogicSCAN | template_LS_A | template_LS_B | template_LS_N |
| MemoryBIST | template_MB_A | template_MB_B | template_MB_N |
| MemorySCAN | template_MS_A | template_MS_B | template_MS_N |

FIG.10

```
define clock information tap controller clock
create_clock ¥
    -name TESTCLK_TCK ¥
    -period 100000 ¥
    -waveform { 0 50000 } ¥
    [get_ports { TCK }]
set_propagated_clock ¥
    [get_clocks { TESTCLK_TCK }]

scan clock
create_clock ¥
    -name SCANCLK_CLK ¥
    -period 100000 ¥
    -waveform { 0 50000 } ¥
    [get_ports { CLK }]
set_propagated_clock ¥
    [get_clocks { SCANCLK_CLK }]
create_clock ¥
    -name SCANCLK_CLK2 ¥
    -period 100000 ¥
    -waveform { 0 50000 } ¥
    [get_ports { CLK2 }]
set_propagated_clock ¥
    [get_clocks { SCANCLK_CLK2 }]

define disable timing information macro
set_disable_timing ¥
    [get_pins { ¥
        RAMSO/RAMS000/WPP/RAM/* ¥
        RAMSO/RAMS001/WPP/RAM/* ¥
        RAMSO/RAMS002/WPP/RAM/* ¥
        RAMSO/RAMS003/WPP/RAM/* ¥
        RAMSO/RAMS004/WPP/RAM/* ¥
        RAMSO/RAMS005/WPP/RAM/* ¥
        RAMSO/RAMS006/WPP/RAM/* ¥
        RAMSO/RAMS007/WPP/RAM/* ¥
    }]
             ⋮ set_false_path ¥
    -from  [get_pins {FF0/Q}]¥
    -to    [get_pins {FF1/D}]
```

METHOD AND APPARATUS FOR SUPPORTING VERIFICATION, AND COMPUTER PRODUCT

CROSS-REFERENCE TO RELATED APPLICATIONS

This application is based upon and claims the benefit of priority from the prior Japanese Patent Application No.2005-080752, filed on Mar. 18, 2005, the entire contents of which are incorporated herein by reference.

BACKGROUND OF THE INVENTION

1. Field of the Invention

The present invention relates to a method and an apparatus for supporting verification in large-scale integration (LSI) design.

2. Description of the Related Art

In LSI design, improvement in work efficiency by shortening a design period has conventionally been demanded. However, in the LSI design, a verification process, which is rather time consuming, to verify whether an LSI properly operates is essential. Especially for an LSI that is required to be large-scale, to have high performance, to be high-speed, and to be low-power consuming, the verification process is important to maintain high quality.

The verification process includes a timing verification. In the timing verification, synopsys design constraint (SDC) is widely used as a file format for condition data for various settings in a timing verification tool. For a setting condition file for operation in a system (user) mode in the SDC, it is possible for a circuit designer to create the setting condition file according to circuit specifications.

On the other hand, for a setting condition file for a test mode operation in the SDC, unless a person conducting test synthesis understands details of test synthesis by the circuit designer, it is difficult for the person to create the setting condition data. Therefore, the setting condition file for the test mode operation has conventionally been created by adding or rewriting a clock domain, an external pin name, a test pin name, and various timing values based on a common template provided for each testing scheme. Related conventional technologies are disclosed in, for example, Japanese Patent Laid-Open Publication Nos. 2000-222452, 2000-276515, and 2000-348086.

However, because the setting condition file for the test mode operation is manually created by a user, an error is likely to occur, and wrong information can be included in the setting condition file.

In the conventional technologies described above, clocks in the system mode operation and in the test mode operation are never contrasted with each other. Consequently, even when the setting condition file for operation in the system mode includes setting condition data that is partially effective in the test mode, such setting condition data is also included in the setting condition file for the test mode operation. When such setting conditions file for the test mode operation is used in the timing verification tool, unnecessary verification is performed. As a result, a verification period becomes long.

Furthermore, timing set in the template does not always correspond with timing set in an automatic test pattern generation (ATPG) tool. As a result, pattern verification using the ATPG tool and timing verification using the timing verification tool do not correspond with each other. Consequently, an error can occur and such a designing process is required to be repeated for correction. Moreover, in creating the setting condition file for the test mode operation, number of processes required for creation is extremely large. This increases a load on the user.

SUMMARY OF THE INVENTION

It is an object of the present invention to solve at least the above problems in the conventional technology.

An apparatus for supporting verification according to one aspect of the present invention includes a detecting unit that detects description data of a false path from setting data for a system mode operation of a target circuit to be verified; an analyzing unit that analyzes the description data in the system mode operation and a test mode operation of the target circuit; a diversion determining unit that determines, based on a result of analysis by the analyzing unit, whether the description data is divertible to the test mode operation; and a generating unit that generates setting data for the test mode operation based on a result of determination by the diversion determining unit.

A method of supporting verification according to another aspect of the present invention includes detecting description data of a false path from setting data for a system mode operation of a target circuit to be verified; analyzing the description data in the system mode operation and a test mode operation of the target circuit; determining diversion, based on a result of analysis at the analyzing, whether the description data is divertible to the test mode operation; and generating setting data for the test mode operation based on a result of determination at the determining diversion.

A computer-readable recording medium according to still another aspect of the present invention stores a computer program for realizing a method for supporting verification according to the above aspects.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a schematic for illustrating setting data for a system mode operation according to the embodiments;

FIG. 5 is a schematic for illustrating a template parameter;

FIG. 6 is a schematic for illustrating a result of a clock domain analysis;

FIG. 7 is a circuit diagram of a user logic;

FIG. 8 is a schematic for illustrating false-path description data that is divertible to the test mode operation;

FIG. 9 is a table for explaining a selection process of selecting the template for the test mode operation;

FIG. 10 is a schematic for illustrating the setting data for the test mode operation.

DETAILED DESCRIPTION OF THE PREFERRED EMBODIMENTS

Exemplary embodiments of the present invention will be explained in detail below with reference to the accompanying drawings.

Figure 1:
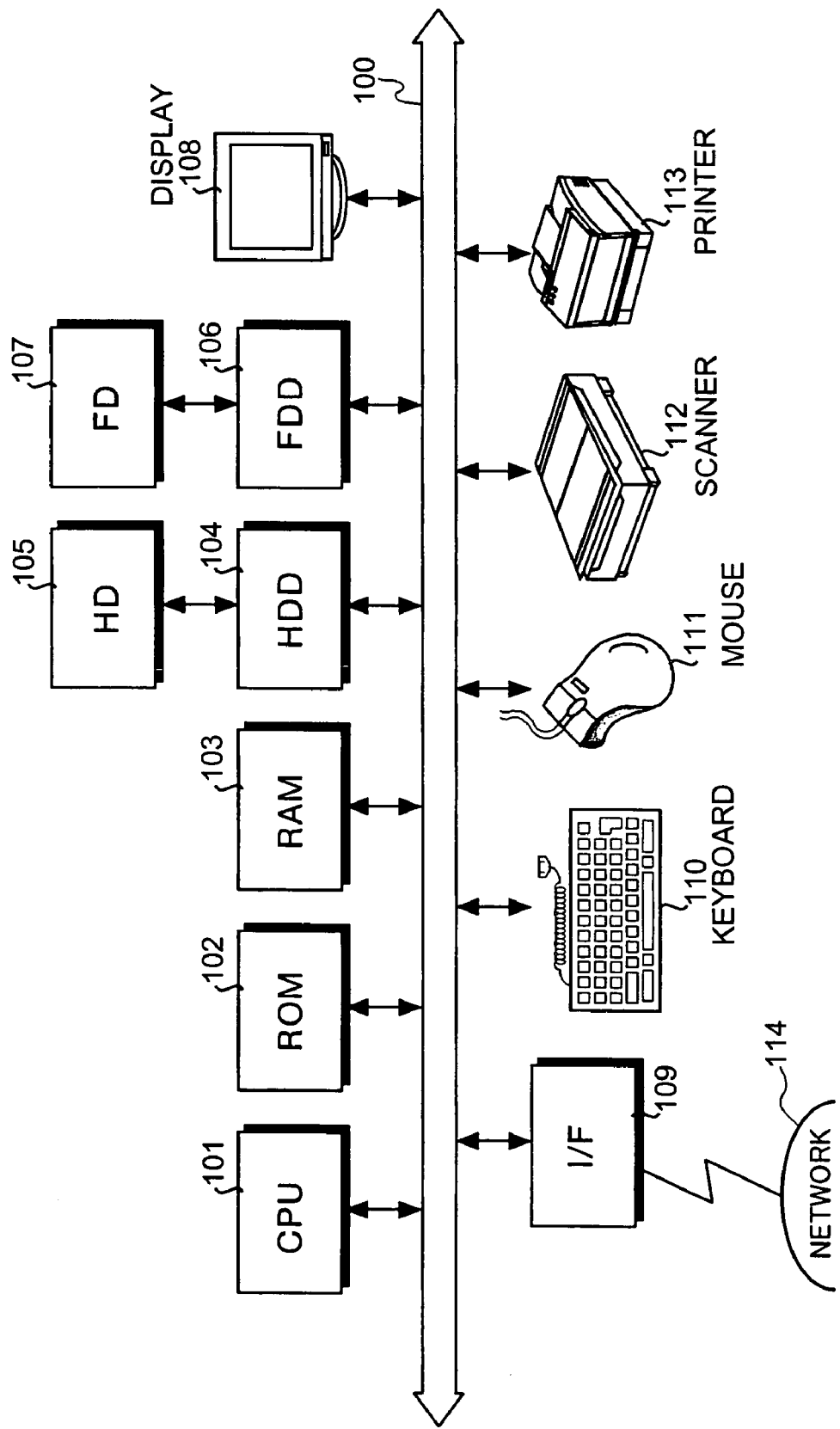
FIG. 1 is a schematic of a hardware configuration of an apparatus for supporting verification according to embodiments of the present invention.

FIG. 1 is a schematic of a hardware configuration of an apparatus for supporting verification according to embodiments of the present invention. As shown in FIG. 1, the apparatus includes a central processing unit (CPU) 101, a read-only memory (ROM) 102, a random access memory (RAM) 103, a hard disk drive (HDD) 104, a hard disk (HD) 105, a flexible disk drive (FDD) 106, a flexible disk (FD) 107 as an example of a removable recording medium, a display 108, an interface (I/F) 109, a keyboard 110, a mouse 111, a scanner 112, and a printer 113. Each of components are connected through a bus 100.

The CPU 101 controls a whole of the apparatus. The ROM 102 stores a computer program such as a boot program. The RAM 103 is used as a work area of the CPU 101. The HDD 104 controls read/write of data from/to the HD 105 in accordance with the control of the CPU 101. The HD 105 stores data that is written in accordance with the control of the HDD 104.

The FDD 106 controls read/write of data from/to the FD 107 in accordance with the control of the CPU 101. The FD 107 stores data that is written by a control of the FDD 106 and lets the apparatus read the data stored in the FD 107.

Apart from the FD 107, a compact disc-read only memory (CD-ROM), a compact disc-readable (CD-R), a compact disc-rewritable (CD-RW), a magneto optical disc (MO), a digital versatile disc (DVD), and a memory card may also be used as the removable recording medium. The display 108 displays a curser, an icon, a tool box as well as data such as documents, images, and functional information. A cathode ray tube (CRT), a thin film transistor (TFT) liquid crystal display, or a plasma display can be used as the display 108.

The I/F 109 is connected to a network 114 such as the Internet through a communication line and is connected to other devices through the network 114. The I/F 109 controls the network 114 and an internal interface to control input/output of data to/from external devices. A modem or a local area network (LAN) adapter can be used as the I/F 109.

The keyboard 110 includes keys for inputting characters, numbers, and various instructions, and is used to input data. A touch panel input pad or a numerical key pad may also be used as the keyboard 110. The mouse 111 is used to shift the curser, select a range, shift windows, and change sizes of the windows on a display. A track ball or a joy stick may be used as a pointing device if functions similar to those of the mouse 111 are provided.

The scanner 112 optically captures an image and inputs image data to the apparatus. The scanner 112 may be provided with an optical character read (OCR) function. The printer 113 prints the image data and document data. For example, a laser printer or an inkjet printer may be used as the printer 113.

Figure 2:
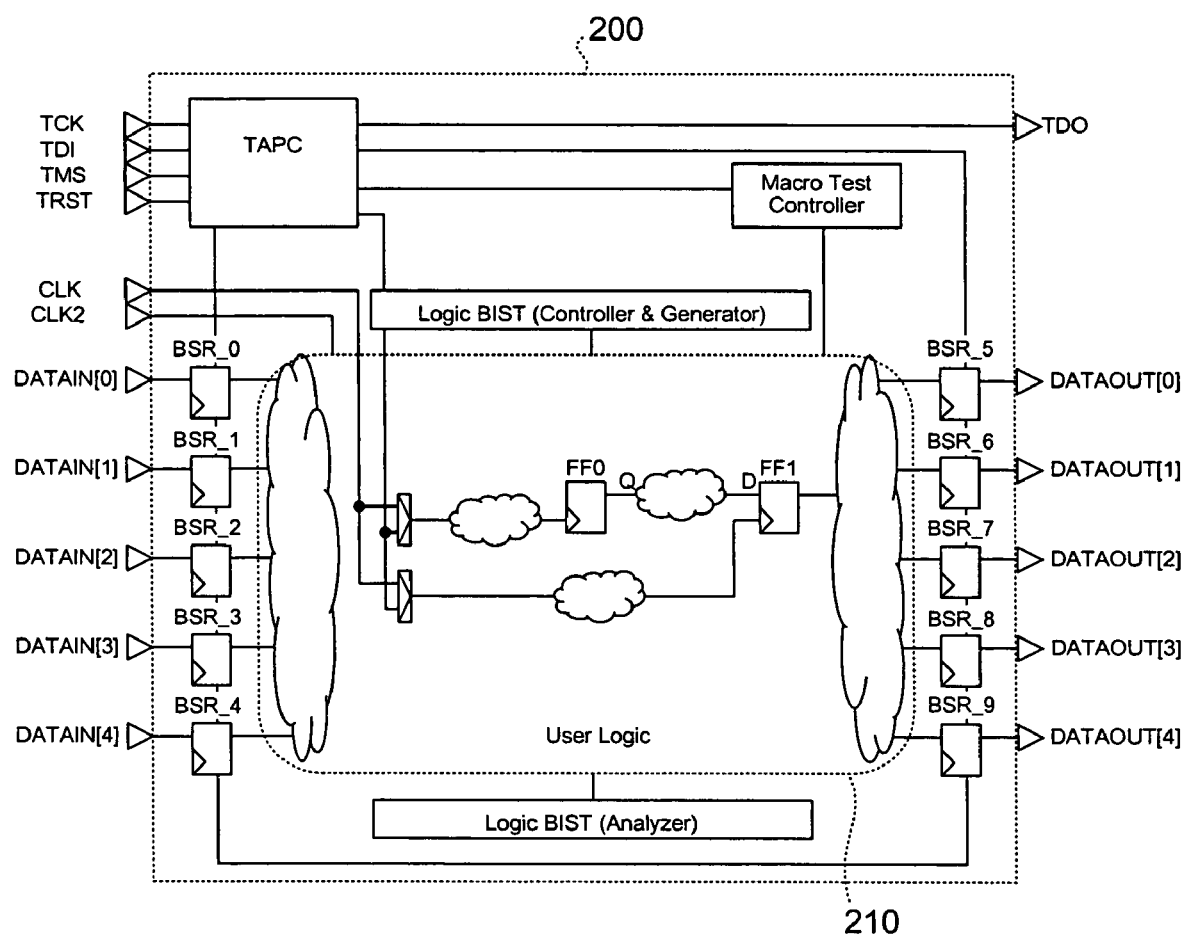
FIG. 2 is a schematic of a target circuit for verification according to the embodiments.

FIG. 2 is a schematic of a target circuit for verification according to the embodiments. As shown in FIG. 2, a target circuit 200 for verification is a test-amenable circuit obtained by performing DFT synthesis and includes a user logic 210 provided by a user. Triangles shown on a left side in FIG. 2 indicate input pins. Beside each of the input pins, an abbreviated title is provided. Similarly, triangles shown on a right side in FIG. 2 indicate output pins, and beside each of the output pins, an abbreviated title is provided.

"BSR_XX" indicates a boundary scan register, and "XX" of "BSR_XX" represents an identification number. Each of rectangular blocks represents a hardware circuit, whose name is shown inside the blocks. Among the hardware circuits, test-access-port controller (TAPC) and macro test controller are included in the user logic 210.

A DFT synthesis database stores data obtained by performing the DFT synthesis on the target circuit 200 shown in FIG. 2. The DFT synthesis database stores test scheme data, TAPC data, external pin data, test pin data, BSR data, scan chain data, and macro test data.

Test scheme data indicates information (for example, boundary scan, logic built-in self test (BIST), and memory BIST) on the test scheme specified for the DFT synthesis.

All the three schemes are applied at a time. The test scheme data is referred to when extracting timing setting data or a template of the setting data for the test mode operation is selected from an ATPG library.

TAPC data includes information on a TAPC used in the target circuit 200. Specifically, the TAPC data includes number of bits of an internal instruction register of the TAPC, information indicating whether a USERCODE register and an IDCODE register are controllable, and type information (standard or customized).

The TAPC data is referred to when extracting the timing setting data or the template of the setting data for the test mode operation from the ATPG library.

External pin data includes external-pin name data and external-pin physical data.

The external-pin name data includes information on names of the external pins of the target circuit 200. The external-pin physical data indicates physical information of the external pins of the target circuit 200. Specifically, the external-pin physical data includes information on a package pin number, a chip pad number, and a pin type, current/post-DFT synthesis addition determination information of pin, current/post-DFT synthesis addition determination information of an I/O buffer, information on a cell library number of the I/O buffer, an instance name of I/O buffer, an I/O buffer type, pull level (pull-up/pull-down, etc.) of I/O buffer, a control pin name of the I/O buffer, a control pin polarity of the I/O buffer, an I/O attribute (input only/output only/both), and a pin pair if the I/O buffer is a differential pin pair. Only information on the I/O attribute required for creating the setting data for the test mode operation is extracted.

Test pin data includes information on roles and connections of all significant pins, both external and internal. Specifically, the test pin data includes information on an external pin name (if the test pin is an external pin), an internal-pin instance name (if the test pin is an internal pin), a test function name, a connection method, a connection condition, a test-function group number, a test-function bit number, a test I/O attribute, a test polarity, and whether the test pin is applied to other purposes in the DFT synthesis.

Among the test pin data, the test function name, the test-function group number, the test-function bit number, and the test I/O attribute are extracted. For internal pins, the internal-pin instance name is also additionally reflected.

BSR data includes information on all the BSRs in the target circuit 200. Specifically, the BSR data includes information on an external pointer of external pin, current/post-DFT synthesis insert information, information on a BSR instance name, a BSR cell library name, a BSR type, presence/absence of CL/PR pin, a reorder group number (contiguity specification when changing connection order), a control BSR count, a BSR data number of control BSR, and a BSR control number of BSR being controlled. From among the BSR data, the BSR instance name and the BSR cell library name are reflected for the access pin of the BSR. scan chain dataScan chain data includes information on each scan chain in the target circuit 200. Specifically, the scan chain data includes information on a scan chain number, a total number of bit of elements forming the scan chain, a head driving-clock pin, a tail driving-clock pin, a number of instance of latch cells, and a number of elements forming the scan chain.

The scan chain data also includes a reorder group number (contiguity specification when changing connection order), a number of bit, an instance name, a scan-data input-pin name, and a scan-data output-pin name. Among the scan chain data, the scan chain number is reflected as the test-function bit number in the head driving-clock pin and the tail driving-clock pin.

Macro test data shown includes information on a memory-macro test circuit. Specifically, the macro test data includes information on a test-circuit instance name, a test-circuit module name, a memory-macro instance name, a memory-macro cell-library name, a test-data output-net number, a test-data input-connection-test-pin function name, a test-data input-pin-connection-net number, a test type, and a memory-macro selection code.

The macro test data also includes a test-circuit-connection-clock pin type of each element forming the memory macro, and a test-circuit-connection-clock pin name. Among the macro test data, the pin type is reflected as the test function name in the test-circuit-connection-clock pin. Also reflected are the test-circuit instance name and the test-circuit module name.

The ATPG library includes information on the ATPG applied to the target circuit 200 shown in FIG. 2, and for instance, includes initialization setting data, and timing setting data.

Initialization setting data includes information on a timing setting type used during each test and an internal control signal value.

Specifically, the initialization setting data includes information concerning to which TAPC the initialization setting data corresponds. The initialization setting data also includes the timing setting type name, such as a Logic-SCAN operation, a Logic-BIST operation, and a Logic-BIST-analysis mode operation. The timing setting is selected based on the type name of the initialization setting data.

Timing setting data includes timing setting data for each of the combinations (types) of presence/absence of the TAPC and an operation to be tested (TAPC and boundary scan operation, logic-BIST operation, memory-BIST operation).

FIG. 3 is a schematic for illustrating setting data 300 for the system mode operation according to the embodiments. The setting data 300 is timing-test setting data for the system mode operation and is provided by the circuit designer. The setting data 300 includes information on the following settings.

clock definition (line beginning with "create_clock-name" in FIG. 3)

input delay of input pin (line beginning with "set_input_delay 5000-max -clock" in FIG. 3)

output delay of output pin (line beginning with "set_output_delay 5000-clock" in FIG. 3)

skew value between clocks (line beginning with "set_clock_uncertainity" in FIG. 3)

false path between clocks (line beginning with "set_false_path¥-from[get_clocks[CLK]]¥-to [get_clocks[CLK2]]" in FIG. 3)

false path between driving clocks (line beginning with "set_flase_path¥-from[get_pins[FFO/Q]]¥-to [get_pins[FF1/D]]) in FIG. 3

It is determined whether or not paths can be diverted to the setting data for the test mode operation based on "false path specification between drive clocks".

A template is a file that includes test mode setting data in which a part different depending on a circuit design is replaced with parameter text strings as well as a conditional equation and a calculating formula using the parameters.

Figure 4:
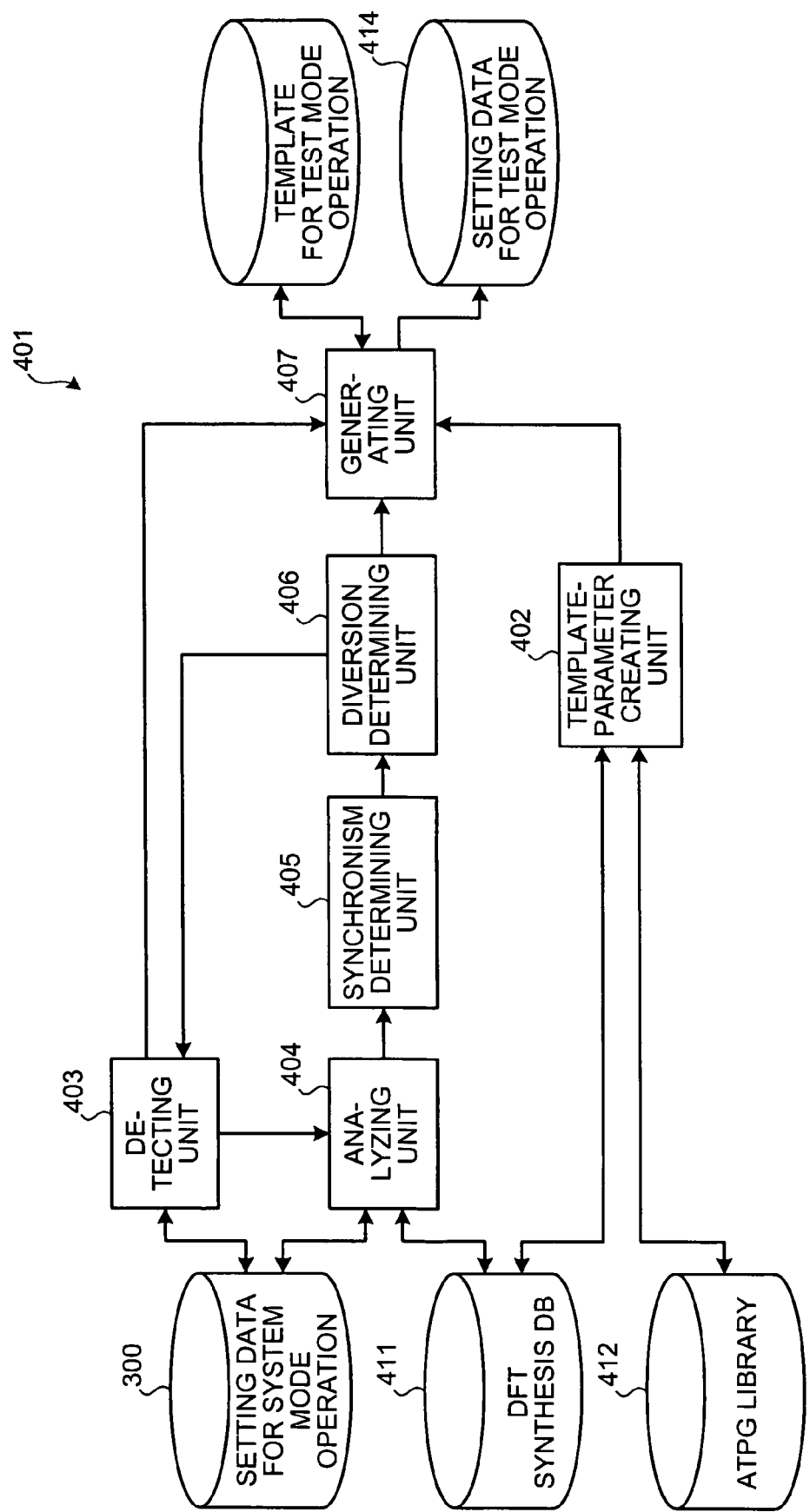
FIG. 4 is a block diagram of a functional configuration of the apparatus.

FIG. 4 is a block diagram of a functional configuration of the apparatus. An apparatus for supporting verification 401 includes a template-parameter creating unit 402, a detecting unit 403, an analyzing unit 404, a synchronism determining unit 405, a diversion determining unit 406, and a generating unit 407.

First, all the data required for creating setting data 414 for a test mode operation can be gathered from a DFT synthesis database 411 and an ATPG library 412. The DFT synthesis database 411 stores the test scheme data, the TAPC data, the external pin data 500, the test pin data, the BSR data, the scan chain data, and the macro test data.

The ATPG library 412 stores the initialization setting data and the timing setting data. The required data can be referred to or extracted from the DFT synthesis database 411 and the ATPG library 412.

In other words, all the pin names and attributes (I/O) are extracted from the external pin data of the DFT synthesis database. Further, pin names of all the internal pins significant to testing, an attribute (I/O), a test function name, a test-function group number, a test-function bit number, and a polarity during testing are extracted from the test pin data of the DFT synthesis database 411.

The test function name, the test-function group number, the test-function bit number, the test polarity of an external pin are extracted from the test pin data of the DFT synthesis database 411 and appended as information on the external pin. An external pin to be accessed is extracted from the BSR data of the DFT synthesis database 411, and the test function name (input/output/control of BSR data), the BSR instance name, and the BSR library name are added to the external pin extracted as information on the external pin.

Chain-head driving-clock pin and chain-tail driving-clock pin of the chain are extracted from the scan chain data of the DFT synthesis database 411, and the test function name (chain head/tail driving clocks) and the test function bit number (scan chain number) are appended as information on the pin. Test-circuit driving-clock pin is extracted from the macro test data of the DFT synthesis database 411, and the test function name (macro test clock), the test function bit number (macro test chain number), the test circuit instance name, and the module name are appended as information on the pin.

The internal control signal value during each test operation (BoundaryScan, Logic capture/shift, and Memory capture/shift) can be extracted from the initialization setting data of the ATPG library 412. The timing setting during each test operation (BoundaryScan, Logic capture/shift, and Memory capture/shift) can be extracted from the timing setting data of the ATPG library 412.

Thus, the values of the following fields can be extracted from the DFT synthesis database 411 and the ATPG library 412.

pin name
attribute (input/output/two-way/internal control)
test function count
test function name
test function group number
test function polarity
connection BSR instance name
connection BSR cell library name
driving memory macro test circuit instance name
driving memory macro test circuit module name
test cycle
rise edge timing
fall edge timing data input timing
strobe point timing
internal control signal value The template-parameter creating unit 402 shown in FIG. 4 creates a template parameter from the field values. FIG. 5 is a schematic for illustrating a template parameter 500. The template parameter 500 includes the parameter names included in the template and data values corresponding to the parameter names in a correlated form. The template parameter 500 is created by breaking up the parameter name into a test function name and a predetermined prefix and suffix, and searching the DFT synthesis database 411 and the ATPG library 412 for data matching the conditions they represent.

For example, the parameter "TCK_fall" is a combination of a test function name "TCK" and a suffix "_fall", where the suffix "fall" is defined to represent "clock fall time when clock rise time is 0". Consequently, the parameter "TCK_fall" represents the test function name "TCK" and the clock fall time "5000" of the pin matching the test function name "TCK whose clock rise time is set as "0".

The template-parameter creating unit 402 selects the template that is to be applied from the TAP control data and the DFT scheme applied in the DFT synthesis database 411 and the ATPG library 412. The template-parameter creating unit 402 then extracts the parameter names (each including a combination of the test function name and a predefined text string representing the I/O attributes) included in the template and identifies the data value represented by the parameter. The template-parameter creating unit 402 then searches the DFT synthesis database 411 and the ATPG library 412 using a result of identification as the search condition and extracts the data corresponding to the parameter value.

The detecting unit 403 shown in FIG. 4 detects false-path description data from the setting data 300 (see FIG. 3) of the target circuit 200. Specifically, the detecting unit 403 detects a description of the false path between the driving clocks, that is, a line "set_false_path¥-from [get_pins[FF0/Q]]¥-to[get_pins[FF1/D]]".

The analyzing unit 404 analyzes the description data for both the system mode operation and the test mode operation of the target circuit 200. Specifically, the analyzing unit 404 determines whether the driving clocks are synchronous for the false-path description data during both the system mode operation and the test mode operation.

More specifically, upon detecting the false-path description data of a false path connecting two points internally in the circuit, the analyzing unit 404 sets system mode condition, and determines the driving clock of a flip-flop (FF) cell at a start point (or an FF cell at a previous stage if a cell at the start point is not an FF cell) and the driving clock of an FF cell at an end point (or an FF cell at a next stage if a cell at the end point is not an FF cell) of the false path by simulation. Similarly, the analyzing unit 404 sets test mode conditions, and determines the driving clock of the FF cell at the start point and the driving clock of the FF cell at the end point of the false path by simulation.

FIG. 6 is a schematic for illustrating a result is a list of results obtained by determining the driving clock of the FF cell at the start point and the FF cell at the end point of the false-path description data. Among the setting data 300, the false path to be analyzed is only the false path described on the last line of the setting data 300 shown in FIG. 3.

Hereinafter, for conveniences' sake, the driving clock input into the register at the start point of the false path in the system mode operation shall be referred to as "first driving clock" and the driving clock input into the register at the end point in the system mode operation shall be referred to as "second driving clock". Furthermore, the driving clock input into the register at the start point in the test mode operation shall be referred to as "third driving clock" and the driving clock input into the register at the end point in the test mode operation shall be referred to as "fourth driving clock".

The synchronism determining unit 405 determines whether the first to fourth driving clocks are all synchronous. The diversion determining unit 406 determines whether description data is to be diverted to the test mode operation based on a result of determination by the synchronism determining unit 405. FIG. 7 is a circuit diagram of a user logic. Driving clocks CK1 to CK3 shown in FIG. 7 propagate "0" end of a multiplexer MUX during the system mode operation "1" end of the multiplexer MUX during the test mode operation.

As shown in FIG. 7, during the system mode operation, the driving clock CK1 is input into an FF cell 701 at the start point of a false path 700 to be the first driving clock, and the driving clock CK2 is input into an FF cell 702 at the end point of the false path 700 to be the second driving clock.

Furthermore, during the test mode operation, the driving clock CK2 is input into the FF cell 701 to be the third driving clock, and the driving clock CK3 is input into the FF cell 702 to be the fourth driving clock.

If the synchronism determining unit 405 determines that all the driving clocks, that is, the first to fourth driving clocks, are synchronous, the diversion determining unit 406 determines that the description data can be diverted. In the user logic 210 shown in FIG. 7, the first driving clock and the second clock are both CK1 and are synchronous. Consequently, if the third driving clock (CK2) and the fourth driving clock (CK3) are synchronous with the driving clock CK1, the false path can be diverted.

If the driving clocks CK1 to CK3 are clock signals input from a single external clock input pin, the driving clocks are considered to be synchronous and the false path is determined to be divertible. If the driving clocks CK1 to CK3 are input from different external clock-input pins, the clocks CK1 to CK3 are considered to be non-synchronous. The difference between the external clock-input pins can be detected by following a logic of a fan-in end of the FF cell 701 and the FF cell 702.

FIG. 8 is a schematic for illustrating false-path description data 800 that is divertible to the test mode operation. The false-path description data 800 is the description data that is determined to be divertible to the test mode operation when the driving clocks input into the FF cell 701 and the FF cell 702 during both the system mode operation and the test mode operation are found to be synchronous in the clock domain analysis result 600 shown in FIG. 6.

Referring back to FIG. 4, the generating unit 407 generates the setting data 414 of the target circuit 200 based on a result of determination by the diversion determining unit 406. Specifically, the generating unit generates the setting data 414 by applying the template parameter 500 and the false-path description data 800 that is determined to be divertible by the diversion determining unit 406 in the template.

More specifically, the generating unit 407 identifies the test scheme based on the DFT synthesis database 411 and selects the template that corresponds to the test scheme identified. FIG. 9 is a table of a selection process of selecting the template for the test mode operation. Assuming that the target circuit 200 shown in FIG. 9 includes a type A TAPC and adopts BoundarySCAN, LogicBisk, and MemoryBist as the test scheme, the template for the test mode operation that can be applied would be "template_BS_A", "template_LB_A", and "template_MB_A".

The generating unit 407 applies the template parameter names in the template by replacing with the template parameter 500. Apart from the template parameter 500, the template also includes keywords representing control (for example, conditional branching, process of applying the template parameter 500, and numerical value calculation between template parameters 500).

The generating unit 407 combines the false-path description data 800 also determined to be divertible during the test mode operation with the setting data 414 extracted (description data for logic test operation testing such as LogicSCAN, and LogicBIST).

FIG. 10 is a schematic for illustrating the setting data 414. The setting data 414 for the test mode operation is data finally obtained by using the template and the false-path description data 800 that is determined to be divertible. The template parameter 500 shown in FIG. 5 is applied in the template, and the false-path description data 800 that is divertible is combined with the template to generate the setting data 414.

Functions of the template-parameter creating unit 402, the detecting unit 403, the analyzing unit 404, the synchronism determining unit 405, the diversion determining unit 406, and the generating unit are realized by the CPU 101 executing a program recorded on a recording medium such as the ROM 102, the RAM 103, the HD 105, and the FD 107 shown in FIG. 1.

Figure 11:
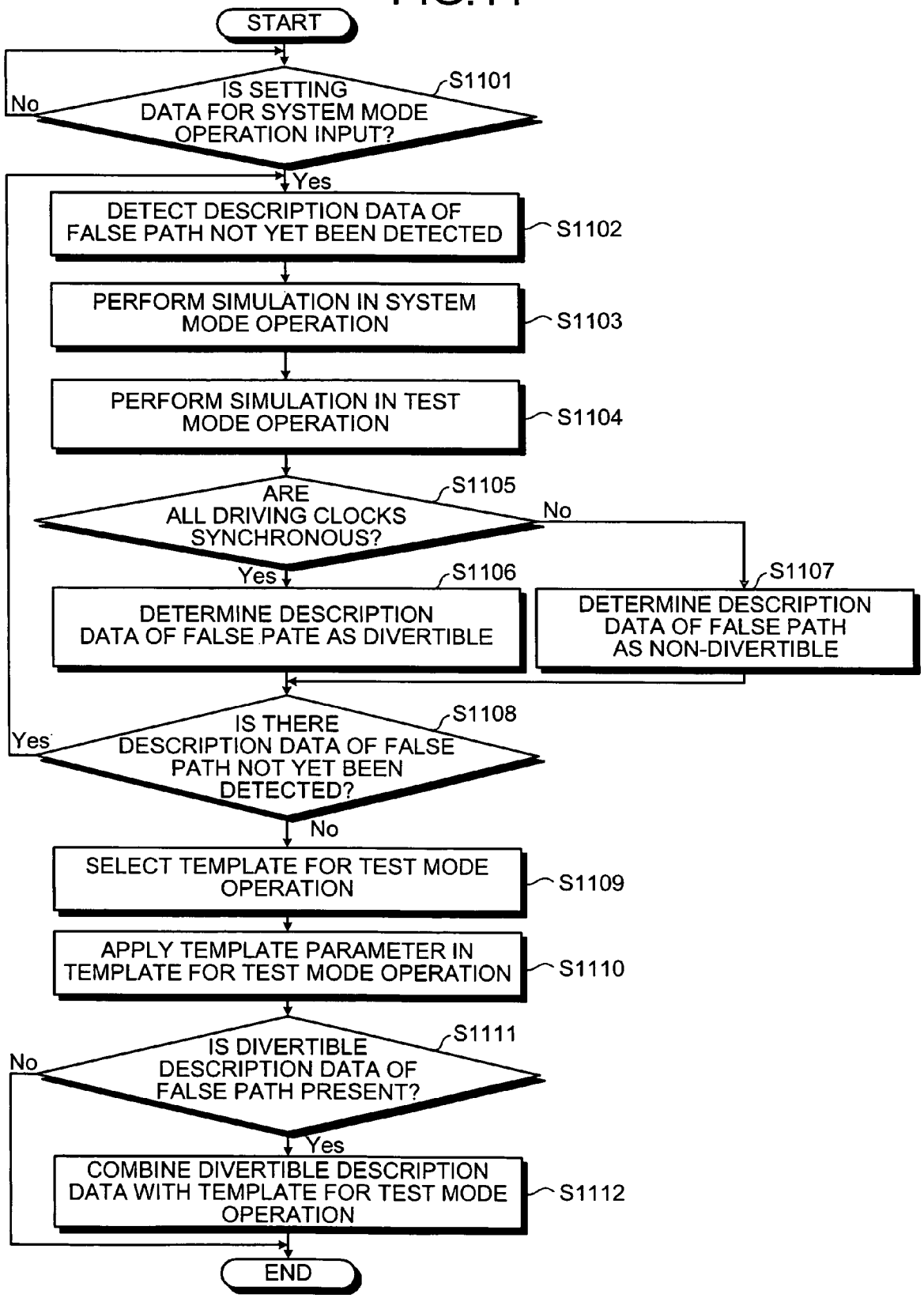
FIG. 11 is a flowchart of a verification supporting process according to the embodiments.

FIG. 11 is a flowchart of a verification supporting process according to the embodiments. As shown in FIG. 11, upon input of the setting data 300 ("YES" at step S1101), the detecting unit 403 detects the false-path description data 800 not yet been detected (step S1120).

The analyzing unit 404 performs simulation on the detected false path in the system mode operation (step S1103). Thus, the first driving clock that is input into the FF cell 701 and the second driving clock that is input into the FF cell 702 are obtained as a result of the simulation.

The analyzing unit 404 then performs simulation on the false path in the test mode operation (step S1104). Thus, the third driving clock that is input into the FF cell 701 and the fourth driving clock that is input into the FF cell 702 are obtained as a result of the simulation.

Then, the synchronism determining unit 405 determines whether the first to fourth driving clocks are all synchronous (step S1105). If all the driving clocks are synchronous ("YES" at step S1105), the false-path description data 800 detected at step S1102 is determined to be a divertible false-path description data (step S1106). If the driving clocks are non-synchronous ("NO" at step S1105), the false-path description data 800 detected is determined to be non-divertible false-path description data (step S1107).

If there still is false-path description data 800 not yet been detected ("YES" at step S1108), the process returns to step S1102 to detect such false-path description data 800. If there is no false-path description data 800 not yet been detected ("NO" at step S1108), the template for the test mode operation that corresponds to the test scheme of the target circuit 200 is selected (step S1109). The template parameter 500 created by the template-parameter creating unit 402 is applied in the template selected (step S1110).

If divertible false-path description data is present ("YES" at step S1111), the divertible false-path description data is combined with the template in which the template parameter 500 is applied (step S1112). Thus, the test mode setting data 414 that includes divertible false-path description data is obtained. If the false-path description data is not divertible ("NO" at step S1111), the process is terminated. Thus, the setting data 414 for the test mode operation that does not include divertible false-path description data is obtained.

According to the present embodiment, the setting data 414 for the test mode operation can be automatically generated. Consequently, manual work by a circuit designer or a test synthesis conductor becomes unnecessary, thereby eliminating possibility of introduction of errors and enhancing quality of the setting data 414.

Furthermore, the false-path description data 800 in the setting data 300 for the system mode operation is automatically diverted, thereby eliminating unnecessary work for verification and shortening the verification period.

The method for supporting that is explained in the embodiments of the present invention is implemented by executing a computer program prepared in advance by a computer, such as a personal computer and a workstation. The computer program is recorded in a computer-readable recording medium, such as the CD-ROM, the MO, and the DVD, and is executed by the computer reading out from the recording medium. The computer program may be a transmission medium that is distributed through a network such as the Internet.

According to the present invention, it is possible to reduce a load of verification work on a user and to achieve efficient verification work.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An apparatus for supporting verification, comprising:
   a detecting unit that detects description data of a false path from first setting data for a system mode operation of a target circuit to be verified;
   an analyzing unit that stimulates the description data of a false path in the system mode operation and a test mode operation of the target circuit, and that outputs, based on a result of a simulation, a first driving clock which supplies to a first register at a start point of the false path in the system mode operation, a second driving clock which supplies to a second register at an end point of the false path in the system mode operation, a third driving clock which supplies to the first register in the test mode operation and a fourth driving clock which supplies to the second register in the test mode operation;
   a determining unit that determines, based on the first driving clock, the second driving clock, the third driving clock and the fourth driving clock, whether the description data is usable to the test mode operation; and
   a generating unit that generates second setting data for the test mode operation based on a result of determination by the determining unit.

2. The apparatus according to claim 1, wherein the determining unit determines whether the description data is usable to the test mode operation by determining whether the first driving clock, the second driving clock, the third driving clock and the fourth driving clock are synchronized with each other.

3. The apparatus according to claim 1, further comprising a synchronism determining unit that determines whether the first to fourth driving clocks are synchronous, wherein
   the determining unit determines whether the description data is usable to the test mode operation based on a result of determination by the synchronism determining unit.

4. The apparatus according to claim 1, wherein the generating unit generates the second setting data for the test mode operation by applying parameters used in the test mode operation and description data of a false path that is determined to be usable by the determining unit in a template of the second setting data for the test mode operation.

5. A method of supporting verification, comprising:
detecting description data of a false path from first setting data for a system mode operation of a target circuit to be verified;
simulating the description data in the system mode operation and a test mode operation of the target circuit;
outputting, based on a result of a simulation, a first driving clock which supplies to a first register at a start point of the false path in the system mode operation, a second driving clock which supplies to a second register at an end point of the false path in the system mode operation, a third driving clock which supplies to the first register in the test mode operation and a fourth driving clock which supplies to the second register in the test mode operation;
determining, based on the first driving clock, the second driving clock, the third driving clock and the fourth driving clock, whether the description data is usable to the test mode operation; and
generating second setting data for the test mode operation based on a result of determination at the determining,
wherein the detecting, the simulating, the outputting, the determining and the generating are performed in a computing system.

6. The method according to claim 5, further comprising determining whether the first driving clock, the second driving clock, the third driving clock and the fourth driving clock are synchronized with each other.

7. The method according to claim 6, wherein the description data is determined to be usable when the first driving clock, the second driving clock, the third driving clock and the fourth driving clock are synchronized with each other.

8. The method according to claim 5, wherein the second setting data for the test mode operation is generated by applying parameters used in the test mode operation and description data of a false path that is determined to be usable at the determining in a template second of the setting data for the test mode operation.

9. A computer-readable recording medium that stores a computer program for supporting verification stored in a readable memory, the computer program makes a computer execute:
detecting description data of a false path from setting data for a system mode operation of a target circuit to be verified;
simulating the description data in the system mode operation and a test mode operation of the target circuit;
outputting, based on a result of a simulation, a first driving clock which supplies to a first register at a start point of the false path in the system mode operation, a second driving clock which supplies to a second register at an end point of the false path in the system mode operation, a third driving clock which supplies to the first register in the test mode operation and a fourth driving clock which supplies to the second register in the test mode operation;
determining, based on the first driving clock, the second driving clock, the third driving clock and the forth driving clock, whether the description data is usable to the test mode operation; and
generating setting data for the test mode operation based on a result of determination at the determining.

10. The computer-readable recording medium according to claim 9, further comprising, determining whether the first driving clock, the second driving clock, the third driving clock and the fourth driving clock are synchronized with each other.

11. The computer-readable recording medium according to claim 10, wherein the description data is determined to be usable when the first driving clock, the second driving clock, the third driving clock and the fourth driving clock are synchronized with each other.

12. The computer-readable recording medium according to claim 9, wherein the second setting data for the test mode operation is generated by applying parameters used in the test mode operation and description data of a false path that is determined to be usable at the determining in a template of the second setting data for the test mode operation.

* * * * *